(12) United States Patent
Dixit et al.

(10) Patent No.: US 6,566,258 B1
(45) Date of Patent: May 20, 2003

(54) BI-LAYER ETCH STOP FOR INTER-LEVEL VIA

(75) Inventors: Girish A. Dixit, San Jose, CA (US); Fusen Chen, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/568,620

(22) Filed: May 10, 2000

(51) Int. Cl.$^7$ .............................................. H01L 21/302
(52) U.S. Cl. ........................ 438/687; 438/692; 438/723; 438/724; 438/740; 438/750; 438/704; 438/734
(58) Field of Search ................................. 438/692, 693, 438/687, 624, 618, 637, 638, 639, 640, 723, 724, 740, 704, 734, 750

(56) References Cited

U.S. PATENT DOCUMENTS

| | | | |
|---|---|---|---|
| 5,612,254 A | 3/1997 | Mu et al. | 437/195 |
| 5,741,626 A | 4/1998 | Jain et al. | 430/314 |
| 6,153,939 A * | 11/2000 | Edelstein | 257/773 |
| 6,258,713 B1 * | 7/2001 | Yu et al. | 438/634 |
| 6,297,162 B1 * | 10/2001 | Jang et al. | 438/706 |

* cited by examiner

*Primary Examiner*—George Goudreau
(74) *Attorney, Agent, or Firm*—Charles S. Guenzer

(57) ABSTRACT

An inter-level metallization structure and the method of forming it, preferably based on copper dual damascene in which the lower-metal level is formed with a exposed metallization and an adjacent, embedded stop layer, both the metallization and embedded stop layer have exposed surfaces approximately level with each other with a lower dielectric layer. The upper-metal level includes a second stop layer deposited over the embedded stop layer and the first metallization and a second dielectric layer. An inter-level via is etched through the second dielectric layer and through the second stop layer and metal is filled into the via to contact the metallization. If the inter-level via is offset over the edge of the metallization, the metal in the via contacts the embedded stop layer and not the first dielectric layer, whereby the embedded stop layer acts as a copper diffusion barrier. The structure and method are particularly useful when the sidewalls of via hole are first coated with a second copper barrier layer but the via bottom is not so coated, thereby decreasing contact resistance and allowing copper diffusion in the absence of an in-line barrier.

14 Claims, 2 Drawing Sheets

BI-LAYER ETCH STOP FOR INTER-LEVEL VIA

FIELD OF THE INVENTION

The invention relates generally to semiconductor integrated circuits and methods of fabricating them. In particular, the invention relates to the structure and fabrication of inter-level metallizations, such as vias.

BACKGROUND ART

Large, advanced semiconductor integrated circuits typically contain a large number of metallization levels to allow for the complex electrical interconnects required for the millions of semiconductor devices included in such silicon integrated circuits. One wiring technology, called dual damascene, has been recently developed and offers many advantages. Two metal levels of such a structure are schematically illustrated in cross section in FIG. 1. A substrate 10 may be the underlying silicon substrate including the semiconductor devices or may be a yet lower wiring level. A first metal layer includes a lower stop layer 12, a lower dielectric layer 14, a middle stop layer 16, and an upper dielectric layer 14. As exemplary materials, the two dielectric layers 14, 18 are composed of silicon dioxide, and the stop layers 12, 16 are composed of silicon nitride.

There are various methods of forming the inter-level metallization, but for convenience the counterbore method will e described. This process is described in more detail by Tang et al. in U.S. Pat. No. 6,380,096, filed Nov. 30, 1998, incorporated herein by reference in its entirety. The three four layers 12, 14, 16, 18 are deposited as unpatterned layers. In one photolithographic step, one or more deep, narrow via holes are etched from the top of the upper dielectric layer 18 through the upper stop layer 16 and the lower dielectric layer 14 to stop on the lower stop layer 12 overlying the substrate 10. The width of the via may be 0.18 $\mu$m or less while its depth may be approximately half of the approximately 1.2 $\mu$m-thick inter-level dual dielectric layers. That is, it has an aspect ratio of at least three and often more. In a second photolithographic step, a wide but shallow trench is etched through the upper dielectric layer 14 to connect with the one or more via holes, which are now shorter than originally. The second etching step is performed with a chemistry that does not etch the two stop layers 12, 16. A short anisotropic etch is used to remove the lower stop 12 exposed at the bottom of the via hole. Thereafter, a single deposition sequence fills both the remaining portion of the deep via hole and the trench with a metal 22 which both acts as a via 24 for the narrow electrical contact to the underlying layer 10 and a horizontal interconnect 24 in the trench area. The metal deposition initially forms over the top of the upper dielectric layer 18, but chemical mechanical polishing (CMP) is used to remove the portion of the softer metal extending above and outside the trench 24.

A second metal level is similarly formed in the same manner with a lower stop layer 30, a lower dielectric layer 32, a middle upper stop layer 34, and an upper dielectric layer 36. A metal layer 38 forms a via 40 and trench interconnect 42. The via 40 of the upper metal level electrically connects to the trench interconnect 24 of the lower metal level.

Dual damascene is particularly useful with copper metallization since no copper etching is required. Copper offers both decreased resistance and lower electromigration. The copper metallization, however, is deposited in a somewhat involved process. Typically, a thin barrier layer of, for example, Ta/TaN is deposited to prevent the copper in the metallization and the silica-based dielectric from intermixing. Then, a thin copper seed layer is coated onto the sides and bottom of the high aspect-ratio holes. The remainder of the metallization is deposited by electrochemical plating (ECP). The copper seed layer both acts as an electrode for the plating and nucleates the growth of the ECP copper. The chemical mechanical polishing of the copper after the copper fill removes from the top of the upper dielectric layer not only the copper outside of the hole but also the barrier layer and any non-oxide layer, such as an anti-reflection coating (ARC) formed over the upper dielectric layer.

The Cu seed layer deposition is preferably performed by self-ionized plasma (SIP) sputtering, as described by Fu et al. in U.S. Pat. No. 6,183,614, filed Aug. 12, 1999, by Chiang et al. in U.S. Pat. No. 6,348,929 filed Oct. 8, 1999, and by Fu et al. in U.S. Pat. No. 6,306,265, filed Apr. 11, 2000, all incorporated herein by reference in their entireties. SIP uses a variety of techniques to ionize a large fraction of the sputtered copper atoms and to accelerate them to the wafer in a low-pressure process. Thereby, the copper atoms approach the wafer nearly perpendicularly and travel deep within the narrow holes. Fu et al. describe an improved version called SIP+ in U.S. Pat. No. 6,277,249. This method uses a sputtering target having an annular vault rising above a generally planar face and the magnetron includes magnets arranged around the walls of the vault. The vault may alternatively be viewed as an inverted annular trough. The Ta/TaN deposition may be performed by SIP sputtering, by a combination of SIP sputtering and chemical vapor deposition (CVD), by ionized metal plating (IMP) using high-density plasma (HDP) sputtering or by other methods.

However, problems arise with the process and structure as described above. The upper level via 40 may not be precisely aligned with the lower level trench 24. As a result, a via 40 positioned near the edge of the underlying trench 24 may be unlanded so that an overhang 46 is formed in which the via 40 of the second metal level overlies the upper dielectric layer 18 of the first metal level. The barrier is usually not needed on the via bottom, and indeed is unwanted because of the contact resistance it introduces between the two metallizations and barrier to copper electromigration across the copper interface of the two metal level. Therefore, the barrier deposition may be tuned to minimize the bottom barrier to the point that its coverage is not continuous or not effective as a barrier. One of the advantages of SIP sputter deposition of the copper seed layer referenced above is that it sputters away the barrier at the bottom of via hole. In this case, in the area of the overhang 46, the copper directly contacts the underlying dielectric layer 18. Any copper diffused into the dielectric is likely to be electrically charged and mobile, thus potentially causing a short across the dielectric. Furthermore, in the first level metal overlying the semiconductor devices, the copper may diffuse into the silicon and poison the active semiconductor areas of the transistor.

Accordingly, it is desired especially for copper metallization that the copper be prevented from diffusing into the dielectric layer. This desire is especially urgent for fine geometries in which the via is likely to be unlanded with respect to the underlying copper metallization and in processes in which the barrier layer is absent at the bottom of the via.

SUMMARY OF THE INVENTION

The invention may be summarized as a vertical interconnect structure in integrated circuits and its method of forming. A first metal layer and a first stop layer are formed side by side in a first dielectric layer. A second stop layer is deposited over the first metal layer and the first stop layer, and a second dielectric layer is deposited over the second stop layer. A hole to be used for a vertical interconnect is etched through the second dielectric layer and second stop layer to contact the first metal layer, and metal is filled into the hole. If the hole is offset from the first metal layer, the metal overlies the first stop layer, which acts as a barrier for diffusion of the metal to the first dielectric layer.

The invention is particularly applicable to copper dual damascene in which the first metal layer is filled into and overflows a trench formed in the first dielectric layer and first stop layer. Chemical mechanical polishing removes excess copper overlying the first stop layer.

DETAILED DESCRIPTION OF THE PREFERRED EMBODIMENTS.

Figure 2:
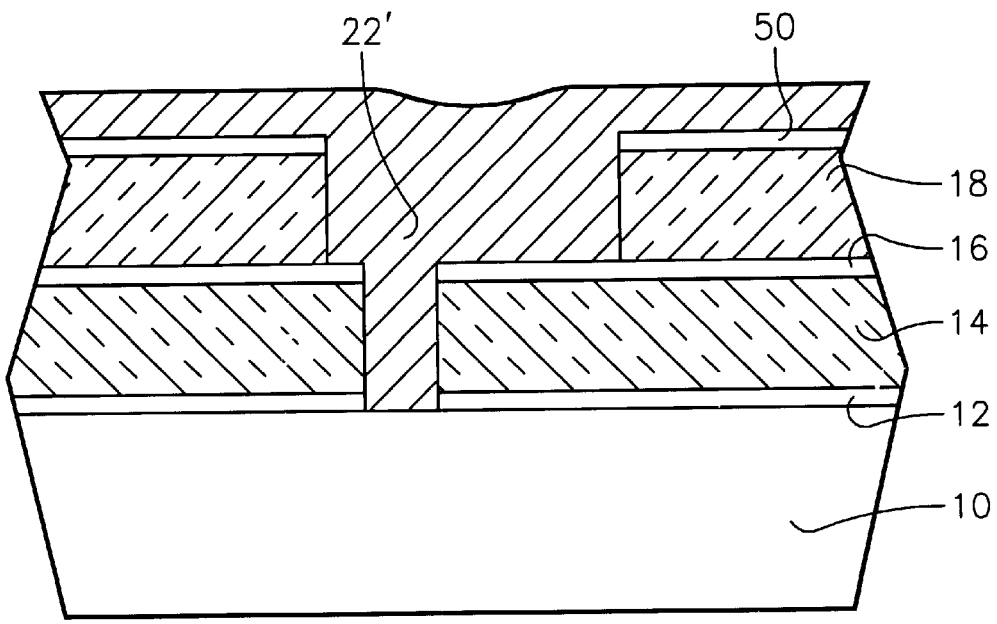
FIG. 2 is a cross-sectional view of a partially developed structure using an embedded stop layer according to one aspect of the invention.

In one aspect of the invention, the lower metal level, as illustrated in the cross-sectional view of FIG. 2, includes a third, upper stop layer 50, which will be referred to as an embedded stop layer 50, deposited over the upper dielectric layer 18. In the counterbore dual-damascene process, the four layers 12, 14, 16, 18 are deposited as planar layers and are photolithographically defined into a trench and at least one via. The embedded stop layer 50 is etched during the via and trench etches and remains at the top of the structure. The via and trench etches need to be modified to first remove the embedded stop layer 50, but its thickness is small and it is exposed. Common dielectric etch recipes can be easily modified for an short, initial unselective etch of the embedded stop layer 50. Thereafter, a metal 22', preferably copper, is filled into the trench and via. In the preferred sequence of barrier deposition, copper seed sputtering and electrochemical plating complete the filling. The copper 22' overflows the trench and also covers the embedded stop layer 50. The exposed copper 22' is then planarized by chemical mechanical polishing (CMP), which continues until at least the copper overlying the embedded stop layer 50 is removed. The CMP may be relatively unselective so that a portion of the embedded stop layer 50 is removed as well as horizontally disposed portions of the copper 22'.

Figure 3:
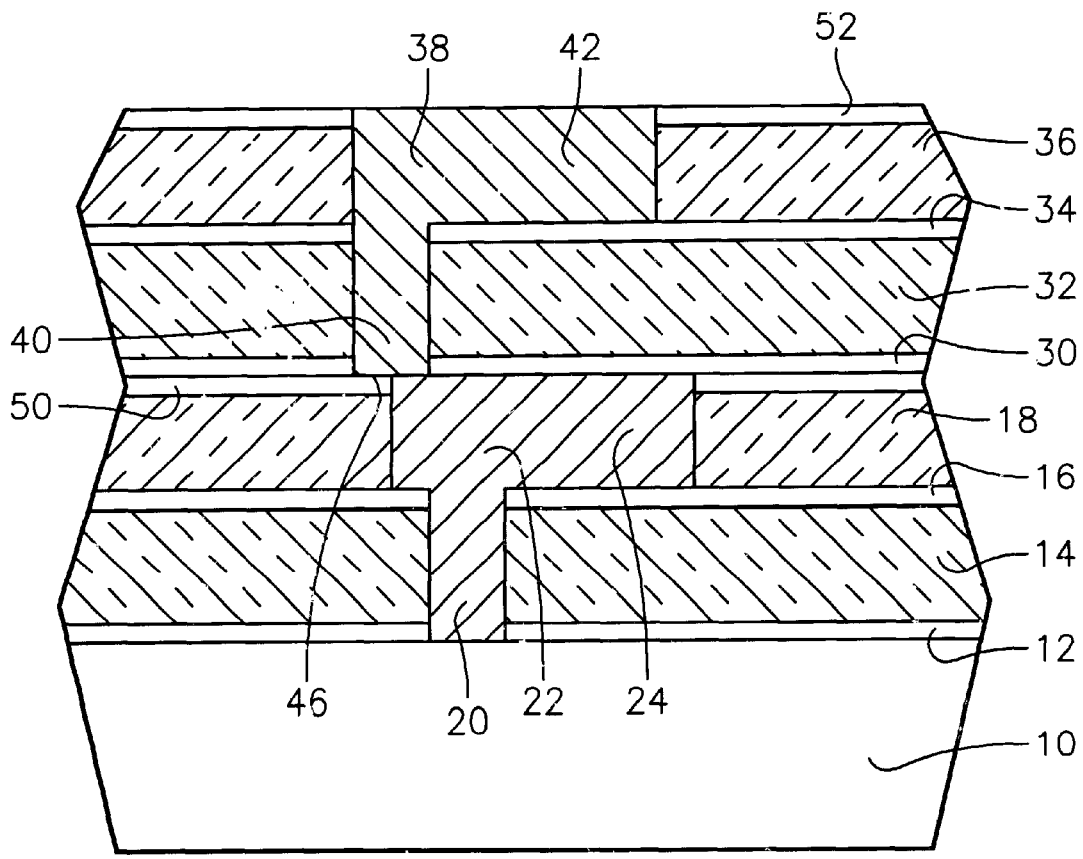
FIG. 3 is a cross-sectional view of a dual-damascene inter-level metallization according to one embodiment of the invention.

The result, as illustrated in the cross-sectional view of FIG. 3 is that the top of the embedded stop layer 50 is level with the top of the copper metal 22 and does not extend over the top of the copper metal 22.

The process then returns to the conventional one described with reference to FIG. 1 to form the upper metal level. However, if yet another metal level is intended, another embedded stop layer 52 is formed over the upper dielectric layer 36 of the upper metal level.

Figure 4:
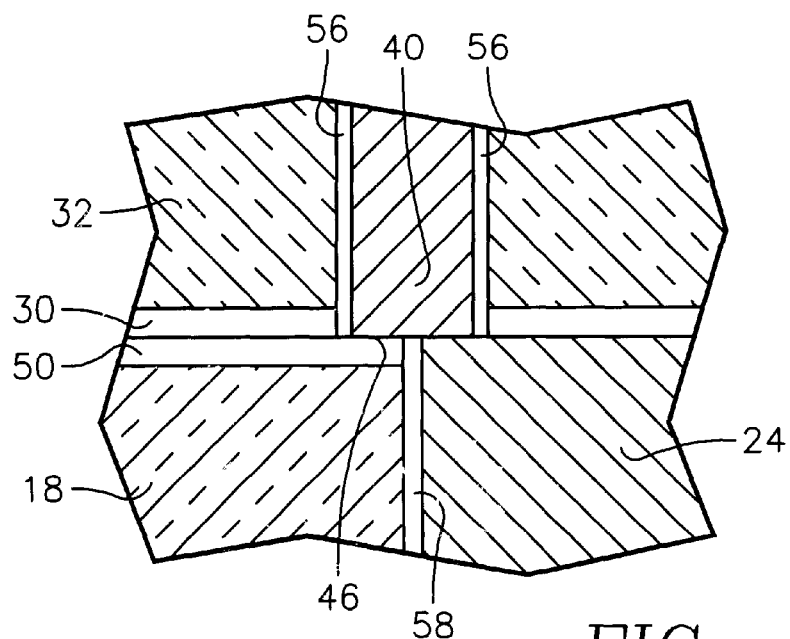
FIG. 4 is an enlarged view of a portion of FIG. 3 additionally showing the via barrier layer.

With the invention, however, the overhang 46 of the second-level metal is formed directly over the embedded stop layer 50 of the first-level metal. This area is illustrated in more detail in the cross-sectional view of FIG. 4. Preferably, a barrier layer 56 is formed on the sides of the via 40, but is either absent at the bottom of the via 40 or is insufficient to act as a barrier. As a result, the upper-level via 40 directly contacts the lower-level trench 24 with no effective barrier therebetween. Nonetheless, a barrier to copper diffusion is maintained since the material of the embedded stop layer 50 is chosen to act as a barrier to the migration of copper between the upper-level via 40 and the dielectric layer 18. A similar barrier layer 58 is formed between the dielectric layer 18 of the first metal level and its metallization 24 and may extend over the top of the embedded stop layer 50 if CMP does not extend to the embedded stop layer 50.

Figure 1:
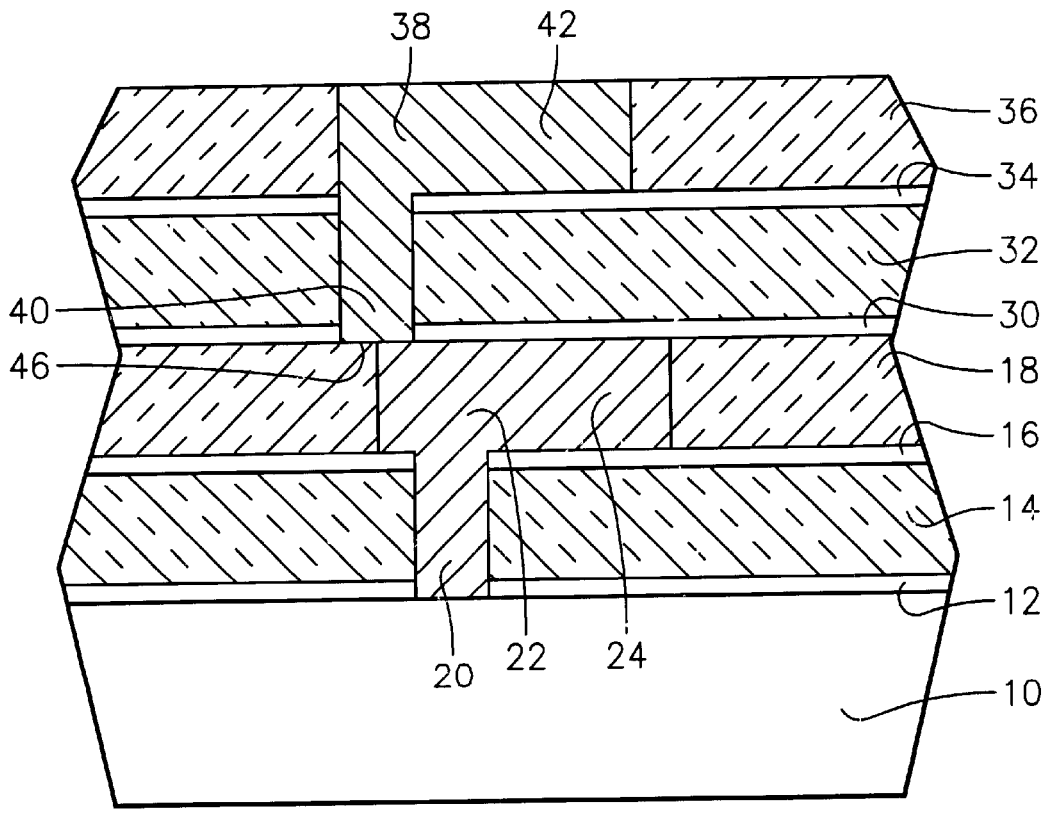
FIG. 1 is a cross-sectional view of a dual-damascene inter-level metallization in the prior art.

It is noted that the lower stop layer 30 of the prior art of FIG. 1, typically composed of nitride, acted as a barrier against diffusion of the lower metal layer 24 to the overlying dielectric layer 32. That is, barrier and stop functions often overlap.

The barrier layer 56 may be formed by a number of methods. The most common method deposits Ta or TaN or Ta/TaN by sputtering, preferably by SIP sputtering. TiN and TaN may be deposited by CVD. A sputtered TaN/Ta layer may be conformally coated with TiN by CVD. Although TaN deposited by CVD is usually not preferred because of its high electrical resistivity, it becomes usable in the case where the TaN is thereafter removed from the sole conduction path at the bottom of the via.

As mentioned previously, SIP sputtering of the copper seed layer advantageously removes at least portions of the barrier at the bottom of the via hole. However, other techniques are possible to effectively eliminate the barrier layer from the via bottom.

The lower stop layer 30 of the upper metal level is typically removed in a substantially unselective etch step characterized as sputtering following the selective etch of the dielectric 32 over the lower stop layer 30. The stop layer removal may be timed so that the lower stop layer 30 is removed but no substantial thickness of the thicker embedded stop layer 50 is removed. Exemplary thickness for the stop layers are between 20 and 100 nm for the overlying lower stop layer 30 and between 20 and 200 nm for the unpolished embedded stop layer 50. After polishing, the embedded stop layer 50 is preferably at least as thick as the overlying lower stop layer 30.

In the above cited patent, Tang et al. provide exemplary stop removal recipes involving difluoromethane, oxygen, and argon for the case where the dielectric is silicon oxide and the both stop layers are silicon nitride. Li et al. in U.S. Pat. No. 6,168,726, filed on Nov. 25, 1998, and incorporated herein by reference in its entirety, provide similar recipes where the dielectric is an oxidized organo-silane film, such as Black Diamond marketed by Applied Materials, Inc. of Santa Clara, Calif., and the stop layers are silicon nitride.

However, these stop removal recipes are not particularly selective and may be applied to yet other stop layers, relative to the dielectric, which also form barriers to copper migration.

The embedded stop layer of the invention provides additional advantages. It protects the underlying dielectric layer during the CMP planarization of the copper which tends to introduce defects into the oxides. Also, depending upon its composition relative to other layers, it may be used as an anti-reflective coating (ARC), similarly to the structure disclosed by Tang et al. in the aforecited patent, or as a cap layer over a softer dielectric, similarly to the structure disclosed by Li et al. in the aforecited patent, or as a hard mask. However, it is not removed and needs to have a composition that acts as a barrier to copper diffusion.

The bi-layer stop layers are preferably formed of either silicon nitride ($SiN_x$, wherein x is preferably 1.33, but may range between 1 and 1.5), silicon carbide (SiC), silicon oxycarbide (SiCO), or silicon oxynitride (SiON). BLOK marketed by Applied Materials in an example of silcon oxycarbide. Both stop layers may be of the same material, or the two layers may be formed of different materials. Yet other stop layer materials may be used.

The invention may be used also with dielectric layers of other materials, particularly low-k dielectrics affording increased immunity to cross talk. Examples of low-k dielectrics are the aforementioned oxidized organo-silane film s, carbon-based dielectrics, such as those referenced by Li et al. in the above cited patents, and fluorosilicate glasses.

The invention has been described with reference to counterbore dual damascene. However, the invention may be used with other dual damascene structures and processes, and may further be used with other vertical, interconnect structures.

It is understood that the preferred copper metallization may be alloyed with a less than 10 atomic percent of alloying elements such as aluminum and magnesium but that the metallization principally comprises copper. Although the invention is particularly useful with copper interconnects, it may be advantageously used with other metallizations. Aluminum metallization using a barrier such as Ti/TiN suffers also from excess contact resistance across the barrier. The invention provides an alternative barrier to inter-diffusion of aluminum and oxygen or other components of the dielectric.

The invention thus allows the decreased contact resistance when the barrier is absent at the bottom of the via hole while still providing a barrier, especially to copper.

What is claimed is:

1. A method of forming an inter-level interconnect, comprising the steps of:
   depositing a first stop layer over a first dielectric layer;
   a first etching step of etching a first hole through said first stop layer and into said first dielectric layer;
   a first filling step of filling said first hole with a first metal;
   depositing a second stop layer over said first stop layer and over and contacting said first metal;
   depositing a second dielectric layer over said second stop layer;
   a second etching step of etching a second hole through said second dielectric layer and said second stop layer to thereby expose at least a portion of said first metal; and
   a second step of filling said second hole with a second metal.

2. The method of claim 1, wherein said second hole overlies an interface between said first stop layer and said first metal.

3. The method of claim 1, wherein said first and second metals principally comprise copper.

4. The method of claim 1, wherein second filling step comprises:
   sputter depositing a copper seed layer on sides of said second hole; and
   electrochemically plating copper over said copper seed layer.

5. A method of forming an inter-level interconnect, comprising the steps of:
   depositing a first stop layer over a first dielectric layer;
   a first etching step of etching a first hole through said first stop layer and into said first dielectric layer;
   a first filling step of filling said first hole with a first metal;
   depositing a second stop layer over said first stop layer and said first metal;
   depositing a second dielectric layer over said second stop layer;
   a second etching step of etching a second hole through said second dielectric layer and said second stop layer; and
   a second step of filling said second hole with a second metal comprising the substeps of
     sputter depositing a copper seed layer on sides of said second hole, and
     electrochemically plating copper over said copper seed layer; and
   depositing a barrier layer onto sidewalls of said second hole to form a copper diffusion barrier, wherein no effective copper diffusion barrier is formed at a bottom of said second hole, whereby contact resistance between said first and second metals is reduced.

6. The method of claim 1, comprising:
   forming a lower-level dual-damascene metal level including said first dielectric layer and said first metal; and
   forming an upper-level dual-damascene metal level including said second dielectric layer and said second metal.

7. The method of claim 1, wherein said first etch stop layer is deposited to a thickness of between 20 and 200 nm and said second stop layer is deposited to a thickness of 20 to 100 nm.

8. The method of claim 7, wherein said chemical mechanically polishing step reduces a thickness of said first etch stop layer.

9. A method of forming an inter-level interconnect, comprising the steps of:
   depositing a first stop layer over a first dielectric layer;
   a first etching step of etching a first hole through said first stop layer and into said first dielectric layer;
   a first filling step of filling said first hole with a first metal;
   depositing a second stop layer over said first stop layer and said first metal;
   depositing a second dielectric layer over said second stop layer;
   a second etching step of etching a second hole through said second dielectric layer and said second stop layer, depositing a barrier layer onto sidewalls of said second hole to form a metal diffusion barrier, wherein less of an effective metal diffusion barrier is formed at a bottom of said second hole; and
   a second step of filling said second hole with a second metal;
   whereby said step of depositing said barrier layers causes a contact resistance between said first and second metals to be reduced.

10. The method of claim 9, wherein said first and second metals principally comprise copper.

11. The method of claim 9, wherein said first and second metals principally comprise aluminum.

12. The method of claim 1, wherein said first filling step includes the steps of:
   overfilling said hole with said first metal; and
   chemical mechanically polishing said first metal to at least expose said first stop layer.

13. The method of claim 1, wherein said first etching step exposes a conductive feature formed in a surface of said first dielectric layer.

14. The method of claim 1, wherein said second metal contacts a portion of said first dielectric layer.

* * * * *